United States Patent
Tajima et al.

(10) Patent No.: US 12,278,109 B2
(45) Date of Patent: Apr. 15, 2025

(54) ETCHING APPARATUS AND ETCHING METHOD

(71) Applicant: KABUSHIKI KAISHA TOSHIBA, Tokyo (JP)

(72) Inventors: Takayuki Tajima, Sagamihara (JP); Kazuhito Higuchi, Yokohama (JP); Susumu Obata, Yokohama (JP); Mitsuo Sano, Kamakura (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 324 days.

(21) Appl. No.: 17/696,067

(22) Filed: Mar. 16, 2022

(65) Prior Publication Data

US 2023/0091900 A1    Mar. 23, 2023

(30) Foreign Application Priority Data

Sep. 17, 2021  (JP) .................................. 2021-151998

(51) Int. Cl.
*H01L 21/306* (2006.01)
*H01L 21/67* (2006.01)

(52) U.S. Cl.
CPC .. *H01L 21/30608* (2013.01); *H01L 21/67075* (2013.01)

(58) Field of Classification Search
None
See application file for complete search history.

(56) References Cited

U.S. PATENT DOCUMENTS

| | | | | |
|---|---|---|---|---|
| 5,725,753 A | * | 3/1998 | Harada | H01L 21/67057 |
| | | | | 257/E21.228 |
| 2003/0092264 A1 | | 5/2003 | Kajita et al. | |
| 2015/0252483 A1 | * | 9/2015 | Ono | C25B 3/25 |
| | | | | 204/252 |

FOREIGN PATENT DOCUMENTS

| | | |
|---|---|---|
| JP | 51-145266 A | 12/1976 |
| JP | 1-104025 U | 7/1989 |
| JP | 6-216110 A | 8/1994 |
| JP | 2003-077887 A | 3/2003 |
| JP | 2003-115474 A | 4/2003 |
| JP | 2003-332300 A | 11/2003 |
| JP | 2003-347272 A | 12/2003 |

(Continued)

OTHER PUBLICATIONS

Ito et al., "Anodically Produced Porous Silicon", Surface Technology, vol. 46, No. 5, 1995, 19 pages (with English Machine Translation).

(Continued)

*Primary Examiner* — Yuechuan Yu
(74) *Attorney, Agent, or Firm* — Oblon, McClelland, Maier & Neustadt, L.L.P.

(57) ABSTRACT

According to one embodiment, an etching apparatus includes a first container including an opening covered by a semiconductor substrate; a second container including an opening covered by a catalyst layer; a first flow path configured to communicate with the first container; a second flow path configured to communicate with the second container; a cation exchange film interposed between the first flow path and the second flow path and allowing at least protons to pass through; and an electric field applier configured to apply an electric field to the semiconductor substrate.

3 Claims, 5 Drawing Sheets

(56) References Cited

FOREIGN PATENT DOCUMENTS

| | | |
|---|---|---|
| JP | 2004-109432 A | 4/2004 |
| JP | 2017-195383 A | 10/2017 |

OTHER PUBLICATIONS

Japanese Decision to Grant a Patent issued Oct. 22, 2024 in Japanese Patent Application No. 2021-151998 (with unedited computer-generated English translation), 5 pages.

* cited by examiner

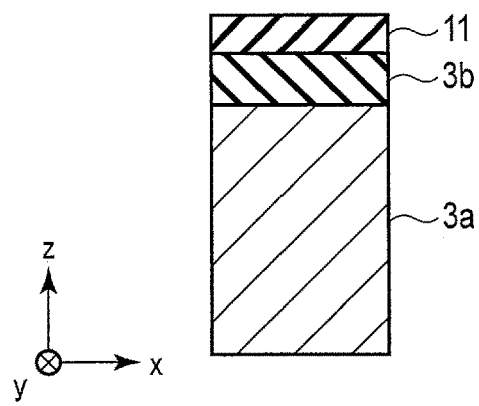
F I G. 4
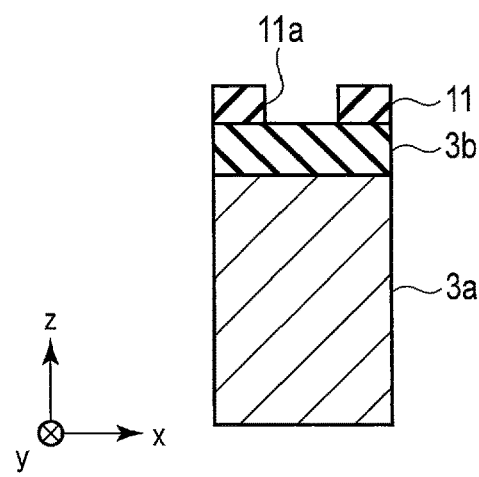
F I G. 5
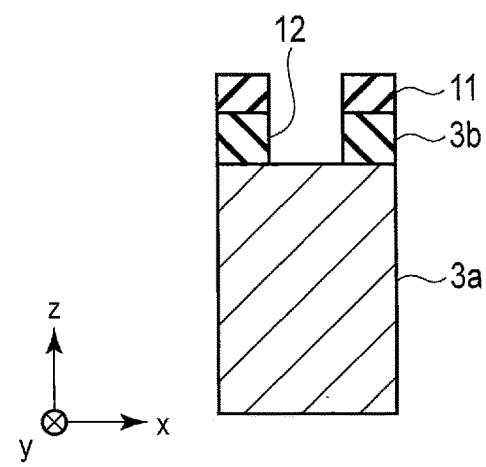
F I G. 6

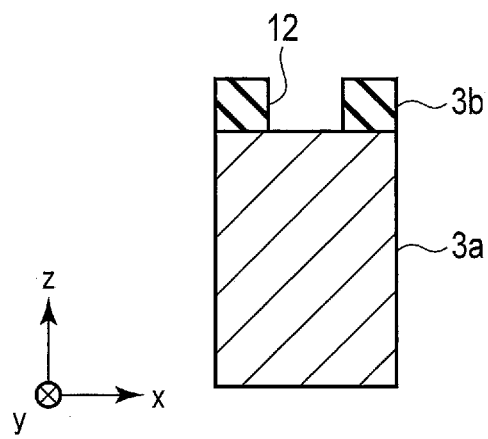
F I G. 7
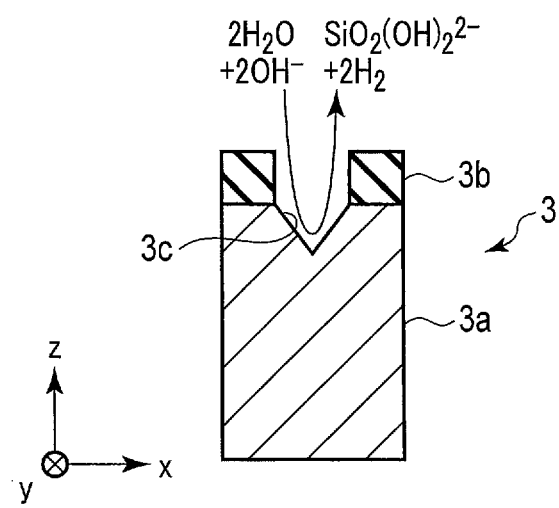
F I G. 8

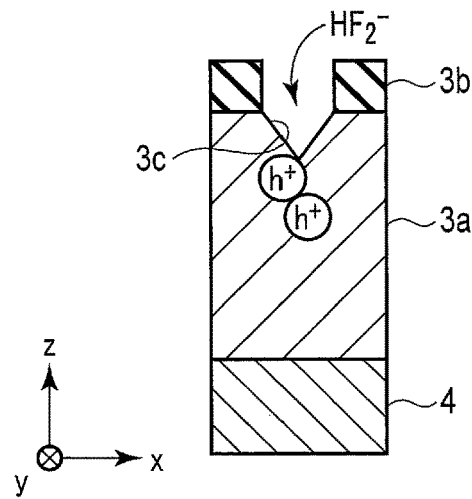
F I G. 11
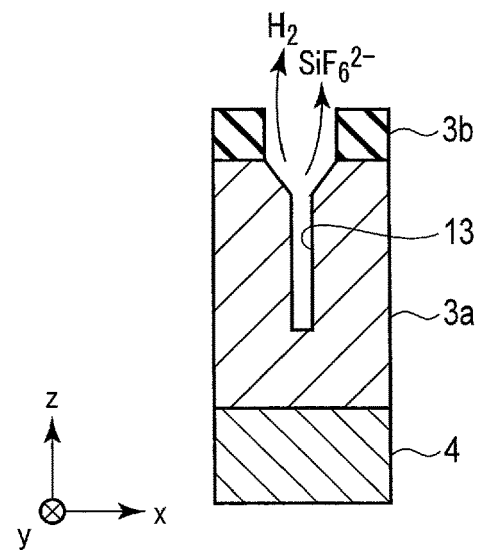
F I G. 12
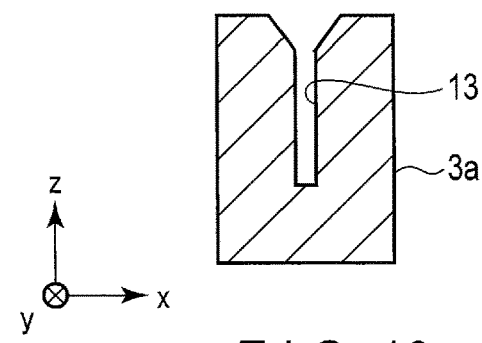
F I G. 13

ETCHING APPARATUS AND ETCHING METHOD

CROSS-REFERENCE TO RELATED APPLICATIONS

This application is based upon and claims the benefit of priority from Japanese Patent Application No. 2021-151998, filed Sep. 17, 2021, the entire contents of which are incorporated herein by reference.

FIELD

Embodiments described herein relate generally to an etching apparatus and etching method.

BACKGROUND

Etching is known as a method of forming holes or grooves in a semiconductor wafer.

As an etching method, a method of performing plasma etching on a semiconductor wafer using an etching mask is known. The etching mask is prepared by patterning a mask layer formed on the semiconductor wafer by laser scribing. A metal-assisted chemical etching (MacEtch) method is known. The MacEtch method is a method of etching a semiconductor substrate using a noble metal as a catalyst, for example. Since a semiconductor wafer is provided with trenches having a high aspect ratio, long-term immersion of semiconductor wafer in a MacEtch solution may cause pore-like damage on the wall surfaces of the trench openings, which leads to problems such as a collapse of the trench.

BRIEF DESCRIPTION OF THE DRAWINGS

FIG. 4 is a cross-sectional view schematically showing a step of a method according to the embodiment.

FIG. 5 is a cross-sectional view schematically showing a step of a method according to the embodiment.

FIG. 6 is a cross-sectional view schematically showing a step of a method according to the embodiment.

FIG. 7 is a cross-sectional view schematically showing a step of a method according to the embodiment.

FIG. 8 is a cross-sectional view schematically showing a step of a method according to the embodiment.

FIG. 11 is a cross-sectional view schematically showing a step of a method according to the embodiment.

FIG. 12 is a cross-sectional view schematically showing a step of a method according to the embodiment.

FIG. 13 is a cross-sectional view schematically showing a step of a method according to the embodiment.

DETAILED DESCRIPTION

In general, according to one embodiment, there is provide an etching apparatus in which a semiconductor substrate having a first main surface and a second main surface located opposite to the first main surface, a catalyst layer formed on the second main surface of the semiconductor substrate, a first solution capable of dissolving an oxide of a semiconductor substrate material, and a second solution containing an oxidizing agent are to be processed. The etching apparatus includes:

a first container configured to store the first solution and including an opening covered by the first main surface of the semiconductor substrate;

a second container configured to store the second solution and including an opening covered by a surface of the catalyst layer;

a first flow path configured to communicate with the first container;

a second flow path configured to communicate with the second container;

a cation exchange film interposed between the first flow path and the second flow path and allowing at least protons to pass through; and an electric field applier configured to apply an electric field to the semiconductor substrate.

According to another embodiment, an etching method includes:

forming a concave part by anisotropic etching on a first main surface of a semiconductor substrate;

forming a catalyst layer on a second main surface located opposite to the first main surface of the semiconductor substrate;

performing etching on the first main surface, with a first solution capable of dissolving an oxide of a semiconductor substrate material being in contact with the first main surface of the semiconductor substrate, with a second solution containing an oxidizing agent being in contact with the catalyst layer, with protons being able to diffuse in the first solution and the second solution via a cation exchange film which allows at least protons to pass through, and with an electric field being applied to the semiconductor substrate.

Embodiments will be described below in detail with reference to the drawings. Structural elements that exert the same or a similar function are referenced by the same symbol throughout the drawings and duplicate descriptions are omitted.

An etching apparatus according to the embodiment may be used in etching of a semiconductor substrate, for example. The semiconductor is selected from, for example, silicon (Si), germanium (Ge), semiconductors consisting of compounds of group III and group V elements such as gallium arsenide (GaAs) and gallium nitride (GaN), and a silicon carbide (SiC). In one example, the semiconductor substrate contains silicon. The term "group" used herein refers to a group in the short-form periodic table.

An example of the etching apparatus according to the embodiment is described with reference to FIG. 1.

Figure 1:
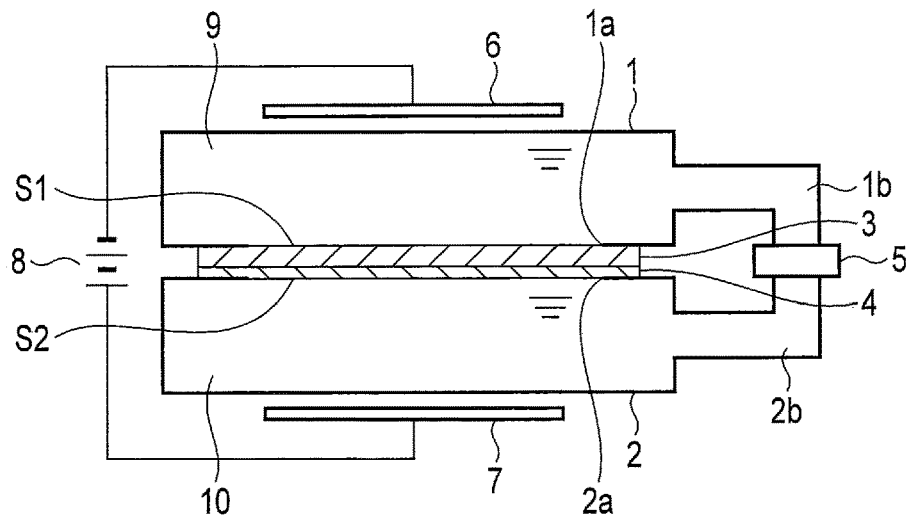
FIG. 1 is a schematic diagram of an etching apparatus of an embodiment.

The etching apparatus shown in FIG. 1 has a first container 1 having a first opening 1a, a second container 2 having a second opening 2a, a first flow path 1b, a second flow path 2b, a cation exchange film 5 that allows at least protons ($H^+$) to pass through, and an electric field applier. The electric field applier includes a first electrode 6, a second electrode 7, and a power supply 8. The processed substrate 3 is a substrate on which an etching process is performed by the etching apparatus. The catalyst layer 4 is used for an etching reaction. Etching in this example may be included in the metal-assisted chemical etching (MacEtch) technique.

The first opening 1a of the first container is located substantially parallel to the bottom surface of the first container 1. The side walls of the first container 1 extend in a substantially perpendicular direction with respect to the bottom surface of the first container 1. A first flow path 1b is provided on the side surface of the first container 1. The first flow path 1b communicates with the space in the first container 1. The first container 1 may be made of a plastic having a tolerance to a first solution or a solution-contacting part thereof may be lined with such a plastic. Examples of the plastic include fluorocarbon polymers such as polytetrafluoroethylene (PTFE) and tetrafluoroethylene-perfluoroalkoxyethylene copolymer (PFA).

In the first container 1, the first solution 9 capable of dissolving an oxide of a semiconductor substrate material is stored. Examples of the oxide of semiconductor substrate material include an oxide of a semiconductor selected from the above-listed semiconductors. This oxide is for example $SiO_2$. Examples of the first solution 9 include an aqueous solution containing at least hydrofluoric acid or ammonium fluoride. A preferable example of the first solution 9 is an aqueous solution containing hydrofluoric acid.

The concentration of hydrogen fluoride in the first solution 9 is preferably in a range of 0.4 mol/L to 20 mol/L, more preferably in a range of 0.8 mol/L to 16 mol/L, and further more preferably in a range of 2 mol/L to 10 mol/L. When the concentration of hydrogen fluoride is too low, it is difficult to achieve a high etching rate. When the concentration of a hydrogen fluoride is too high, the controllability of etching in a processing direction (for example, the thickness direction of the semiconductor substrate) may be lowered.

The second opening 2a of the second container is located substantially parallel to the bottom surface of the second container 2. The side walls of the second container 2 extend in a substantially perpendicular direction with respect to the bottom surface of the second container 2. A second flow path 2b is provided on the side surface of the second container 2. The second flow path 2b communicates with the space in the second container 2. The second container 2 may be made of a plastic having a tolerance to a second solution or a solution-contacting part thereof may be lined with such a plastic. Examples of such a plastic include fluorocarbon polymers such as polytetrafluoroethylene (PTFE) and tetrafluoroethylene-perfluoroalkoxyethylene copolymer (PFA), and polyvinyl chlorides.

In the second container 2, the second solution 10 containing an oxidizing agent is stored. The oxidizing agent can be selected from, for example, hydrogen peroxide, nitric acid, $AgNO_3$, $KAuCl_4$, $HAuCl_4$, $K_2PtCl_6$, $H_2PtC_{16}$, $Fe(NO_3)_3$, $Ni(NO_3)_2$, $Mg(NO_3)_2$, $Na_2S_2O_8$, $K_2S_2O_8$, $KMnO_4$ and $K_2Cr_2O_7$. Hydrogen peroxide is preferred as the oxidizing agent because it neither generates any harmful byproduct nor contaminates a semiconductor element.

The concentration of the oxidizing agent such as hydrogen peroxide in the second solution 10 is preferably in a range of 0.2 mol/L and 8 mol/L, more preferably in a range of 0.5 mol/L to 5 mol/L, and further more preferably in a range of 0.5 mol/L to 4 mol/L. When the concentration of the oxidizing agent is too low, it is difficult to achieve a high etching rate. When the concentration of an oxidizing agent is excessively high, excessive side etching may occur.

The processed substrate 3 is arranged between the first container 1 and the second container 2. The first main surface S1 of the processed substrate 3 is adjacent to an edge part that defines the first opening 1a of the first container 1. A packing, such as an O-ring may be interposed between the edge part and the first main surface S1 of the processed substrate 3. The first main surface S1 of the processed substrate 3 covers the first opening 1a of the first container 1, and the first main surface S1 of the processed substrate 3 is thus in contact with the first solution 9.

Figure 2:
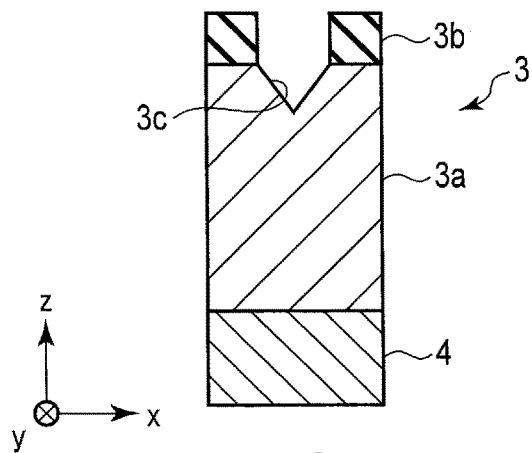
FIG. 2 is a cross-sectional view schematically showing a processed substrate and a catalyst layer used in the etching apparatus of the embodiment.

The processed substrate 3 includes a semiconductor substrate 3a and a mask layer 3b, as illustrated in FIG. 2. The semiconductor substrate 3a is for example a semiconductor wafer. The semiconductor wafer may be doped with impurities, and semiconductor elements, such as transistors and diodes, may be formed on the semiconductor wafer. The main surface of the semiconductor wafer may be in parallel to any crystal plane of the semiconductor. A silicon wafer in which the first main surface is a (100) surface is used in this example.

A mask layer 3b is provided on the first main surface along the xy plane of the semiconductor substrate 3a. The mask layer 3b has an opening that extends in a y-axis direction. An opening may be provided at certain intervals along an x-axis direction. The mask layer 3b may be made of an inorganic material, such as a silicon nitride compound, for example. At the opening part of the mask layer 3b, the first main surface along the xy plane of the semiconductor substrate 3a is exposed. On this exposed first main surface, a groove 3c having a V-shaped transverse section, for example, is provided. This groove 3c having a V-shaped transverse section has a depth in the z-axis direction and extends in the y-axis direction. The V-shaped transverse section is a cross section that is obtained when the groove 3c is cut in the x-axis direction. The groove 3c having the V-shaped transverse section is an example of a tapered concave part in which the bottom area is smaller than the opening area at the first main surface. The opening area in the first main surface of the groove 3c can be calculated from a width and a length of the groove 3c in the first main surface. The bottom area of the groove 3c can be calculated from a width and a length of the bottom surface of the groove 3c. The groove 3c having a V-shaped transverse surface is an example where the bottom area size is zero. To machine a groove in a perpendicular direction (z-axis direction), a smaller width of the bottom surface is preferable, and the most preferable bottom area size is zero.

As shown in FIG. 2, the catalyst layer 4 is formed on the second main surface along the xy plane of the semiconductor substrate 3a. The second main surface is located at an opposite or rear side of the first main surface. The surface S2 along the xy plane of the catalyst layer 4 is adjacent to an edge part that defines the second opening 2a of the second container 2. A packing such as an O-ring may be interposed between the edge part and the surface S2 of the catalyst layer 4. The surface S2 along the xy plane of the catalyst layer 4 covers the second opening 2a of the second container 2, and the surface S2 is thus in contact with the second solution 10.

As described above, the processed substrate 3 including the semiconductor substrate 3a and the catalyst layer 4 is arranged between the first opening 1a of the first container 1 and the second opening 2a of the second container 2. Since a liquid does not permeate into the semiconductor substrate 3a, the processed substrate 3 and the catalyst layer 4 function as barriers, and the first solution 9 in the first container 1 and the second solution 10 in the second container 2 do not come into contact or mix since the processed substrate 3 and the catalyst layer 4 are interposed therebetween.

The catalyst layer 4 includes a noble metal, for example. The noble metal is, for example, at least one metal selected from a group consisting of Au, Ag, Pt, Pd, Ru, and Rh.

The catalyst layer 4 may be a noble metal film or noble metal particles. The noble metal film or noble metal particles can promote a reaction of the second solution 10 and can act as a catalyst for injecting positive holes (h$^+$) into the semiconductor substrate 3a.

The catalyst layer 4 may have a discontinuous portion.

The thickness of the catalyst layer 4 is preferably in a range of 0.01 µm to 0.3 µm, more preferably in a range of 0.05 µm to 0.2 µm. The thickness of the catalyst layer 4 is, if it is a noble metal film, a thickness of the film. If the catalyst layer 4 is formed by noble metal particles, the thickness is a distance from a surface along the xy plane of the catalyst layer 4 to the other surface along the xy plane in an image of a cross section of the catalyst layer 4 observed by a scanning electron microscope in a direction parallel to the thickness direction of the catalyst layer 4.

The particle size of the noble metal particles is preferably in a range of 0.001 µm to 1 µm, and more preferably in a range of 0.01 µm to 0.5 µm.

Herein, the "particle diameter" is a value obtained by the following method. First, an image of the main surface of the catalyst layer 4 is captured by the scanning electron microscope. The magnification is set to a range of 10000 to 100000. Next, the area of the noble metal particles is obtained from the image. Then, assuming that the noble metal particles are spherical, the diameter of the noble metal particles is obtained from the foregoing area. The diameter is determined as a "particle size" of the noble metal particles.

The catalyst layer 4 can be formed by, for example, electroplating, reduction plating, or displacement plating. The catalyst layer 4 may be formed by applying a dispersion containing the noble metal particles, or vapor phase deposition such as evaporation and sputtering.

In the cation exchange film 5 that allows at least protons to pass through, a first surface is in contact with the outlet of the first flow path 1b, and a second surface located opposite to the first surface is in contact with the outlet of the second flow path 2b. Thus, the cation exchange film 5 is interposed between the outlet of the first flow path 1b and the outlet of the second flow path 2b. Protons can move between the first solution 9 and the second solution 10, via the cation exchange film 5 that allows at least protons to pass through. Charge neutrality between the first solution 9 and the second solution 10 can be thus maintained. Protons may be hydrated. Cations other than protons may be able to move between the solutions. The anions included in the first solution 9 and the second solution 10, on the other hand, cannot pass through the cation exchange film 5. Examples of the anions include fluoride ions (F$^-$).

Examples of the cation exchange film 5 that allows at least protons to pass through include a perfluorosulfonic acid polymer-containing film. The perfluorosulfonic acid polymer-containing film has an excellent tolerance against a component (for example, hydrofluoric acid) of the first solution 9 and an oxidizing agent of the second solution 10. An example of the perfluorosulfonic acid polymer-containing film is a commercial Nafion (trade mark) film.

The electric field applier is explained. A first electrode 6 and a second electrode 7 are provided in such a manner that the first container 1, the processed substrate 3, the catalyst layer 4, and the second container 2 are arranged therebetween. The power supply 8 is a DC power supply. The first electrode 6 is electrically connected to the negative pole of the power supply 8. The second electrode 7 is electrically connected to the positive pole of the power supply 8. In an electric field generated between the first electrode 6 and the second electrode 7, the first container 1, the processed substrate 3, the catalyst layer 4, and the second container 2 are arranged. An electric field is thus applied to the semiconductor substrate 3a.

Although illustration is omitted, the etching apparatus may include a mechanism for refilling the first and second solutions and a mechanism for discharging used first and second solutions.

Hereinafter, an example of an application of the above-described etching apparatus to the method according to the present embodiment is described with reference to FIGS. 3 to 13. In each drawing, the thickness direction of the semiconductor substrate 3a is defined as the z-axis direction, and a surface along a direction perpendicular to the thickness direction of the semiconductor substrate 3a (main surface) is defined as the xy plane. The components that have been described with reference to FIGS. 1 and 2 are referred to by the same symbols, and explanations of these components are omitted.

(Formation of Mask Layer 3b)

Prior to crystal anisotropic etching, a step of forming a mask layer 3b may be performed. The mask layer 3b is prepared by a method that includes the following steps for example. The method is hereinafter described with reference to FIGS. 3 to 7.

Figure 3:
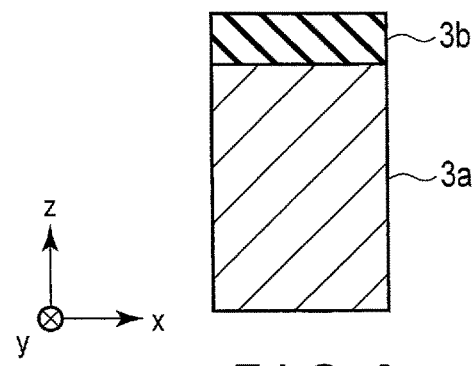
FIG. 3 is a cross-sectional view schematically showing a step of a method according to the embodiment.

As shown in FIG. 3, a mask layer 3b is formed on the first main surface along the xy plane of the semiconductor substrate 3a.

Next, as shown in FIG. 4, a resist layer 11 is formed on the mask layer 3b on the semiconductor substrate 3a. The resist layer may be made of a photoresist, for example.

Next, as shown in FIG. 5, the resist layer 11 is processed in a desired pattern shape to form an opening 11a. The pattern is formed by photolithography, for example.

Next, as shown in FIG. 6, the mask layer 3b is patterned into a desired pattern shape by etching so as to provide an opening 12 in the mask layer 3b.

Next, the resist layer is removed, thereby providing the mask layer 3b having the opening 12 on the first main surface along the xy plane of the semiconductor substrate 3a, as shown in FIG. 7.

(Crystal Anisotropic Etching)

As shown in FIG. 8, a concave portion is formed by anisotropic etching in the mask layer 3b at a portion being exposed from the opening 12. Since the first main surface is, for example, a (100) plane of a silicon wafer, a groove 3c having a V-shaped transverse section is formed.

Anisotropic etching may be, for example, wet etching using an etching solution containing at least one of tetramethylammonium hydroxide (TMAH), KOH, and the like.

(Formation of Catalyst Layer 4)

Figure 9:
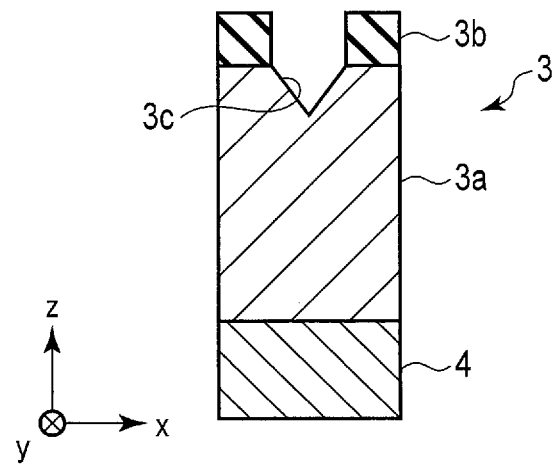
FIG. 9 is a cross-sectional view schematically showing a step of a method according to the embodiment.

As shown in FIG. 9 for example, a catalyst layer 4 is formed on the second surface along the xy plane of the semiconductor substrate and located at a rear or opposite side of the first main surface.

(Etching)

Etching is performed using an etching apparatus according to the embodiment, for example. Etching performed by the etching apparatus according to the embodiment is described with reference to FIG. 10 to FIG. 13. The example shown in FIG. 10 through FIG. 13 is an example wherein a hydrofluoric acid aqueous solution is used as the first solution 9, a hydrogen peroxide ($H_2O_2$) aqueous solution is used as the second solution 10, and a Au layer is used as the catalyst layer 4. First, the processed substrate 3 and the catalyst layer 4 are set at the predetermined position in the etching apparatus, and the first solution 9 is stored in the first container 1 and the second solution 10 is stored in the second container 2. Thus, the first solution 9 is brought into contact with the first main surface of the semiconductor substrate 3a, and the surface of the catalyst layer 4 is brought into contact with the second solution 10.

The power supply 8 is turned on and a DC electric field is formed between the first electrode 6 and the second electrode 7, and a DC electric field is applied to the semiconductor substrate 3a.

Figure 10:
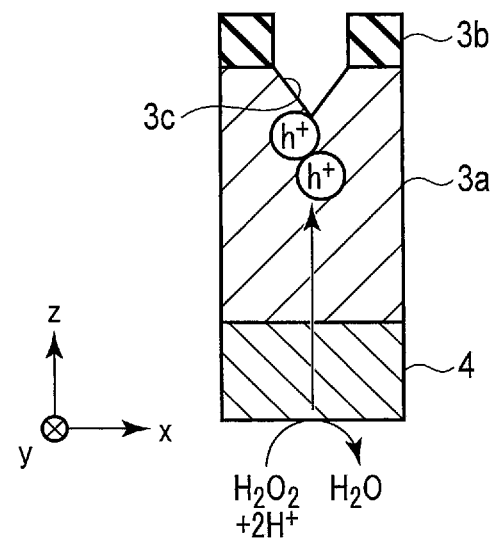
FIG. 10 is a cross-sectional view schematically showing a step of a method according to the embodiment.

As shown in FIG. 10, since the second solution 10 is in contact with the surface of the catalyst layer 4, a reduction reaction in hydrogen peroxide serving as an oxidizing agent occurs and positive holes are thus generated. The groove 3c has a V-shaped transverse section, and has in turn a shape tapering down toward the bottom. For this reason, positive holes concentrate in the bottom of the groove 3c of the semiconductor substrate 3a. As a result, at the bottom of the groove 3c of the semiconductor substrate 3a, a oxidation reaction of a semiconductor occurs and for example a Si oxide is generated.

As shown in FIG. 11, since the first solution 9 is in contact with the groove 3c of the semiconductor substrate 3a, a dissolution of the Si oxide into the first solution 9 occurs; for example, the Si oxide is dissolved as water-soluble hexafluorosilicic acid ($H_2SiF_6$). As a result, as shown in FIG. 12, since the etching proceeds in a downward direction parallel to the z-axis direction from the bottom of the concave part, and a trench 13 is thereby formed.

Subsequently, the mask layer 3b and the catalyst layer 4 are removed from the semiconductor substrate 3a as shown in FIG. 13.

As described above, a component that dissolves an oxide of the semiconductor substrate material is disposed on the surface of the semiconductor substrate 3a on which a trench should be formed, and a catalyst layer and an oxidizing agent are disposed on the other surface of the semiconductor substrate 3a. If etching is performed with such a separation, it is possible to prevent parts not to be aimed, for example trench wall surfaces, etc. from being etched and becoming porous, and to form trenches 13 in a downward direction along the z-axis direction from the bottom of the groove 3c of the semiconductor substrate 3a. Thus, according to an etching method of the present embodiment, it is possible to prevent pore-like damage on the wall surfaces even when trenches having a high aspect ratio are formed. Furthermore, since the formation of the catalyst layer 4 does not absolutely require particulate precipitation and it is still possible to form a catalyst layer 4 with filmy precipitation; difficulties in the catalyst layer forming process can therefore be lowered.

In the above-described example of FIG. 1, a groove 3c having a V-shaped transverse section is formed on the first main surface along the xy surface of the semiconductor substrate 3a; however, the shape of the concave part such as a groove is not limited to this example. It suffices that the concave part has a tapered shape in which a bottom area (including zero) is smaller than an area of the opening on the first main surface of the semiconductor substrate 3a. Other examples of the concave part include a reversed pyramid shape.

The method according to the present embodiment is applicable to a pattern forming method with which concave parts such as trenches or through-holes are formed on a semiconductor substrate, for example. According to the method of the present embodiment, a semiconductor apparatus can be manufactured through a step of forming a conducive layer in concave parts or through holes formed on a semiconductor substrate by plating, or a step of forming a dielectric film by chemical vapor deposition (CVD), or a step of forming an interconnect layer above a semiconductor substrate.

An example in which the apparatus and method according to the embodiment is applied to a semiconductor substrate made of a silicon wafer in which a first main surface is a (100) plane having a thickness of 625 µm is described hereinafter.

First, a mask layer 3b made of a silicon nitride compound is formed according to the method described in the above with reference to FIGS. 3 to 7 on the first main surface along the xy plane of the semiconductor substrate.

Subsequently, concave parts are formed on the first main surface of the semiconductor substrate 3a by crystal anisotropic etching. As an etching solution, KOH of 25 wt % is used. The formed concave part is a groove 3c having a V-shaped transverse section when cut in the x-axis direction, and the depth of the groove 3c along the z-axis direction is 1.4 µm. The width of the groove 3c along the x-axis direction is 2 µm.

A Au catalyst layer 4 is formed on the second main surface of the semiconductor substrate 3a by sputtering. Hereinafter, the semiconductor substrate 3a and the Au catalyst layer 4 are disposed in the etching apparatus shown in FIG. 1.

As the first solution 9, a hydrofluoric acid aqueous solution having a concentration of 20 mol/L is prepared to fill the first container 1. As the second solution 10, a hydrogen peroxide aqueous solution having the concentration of 0.5 mol/L is prepared to fill the second container 2.

As the cation exchange film 5 that allows at least protons to pass through, a perfluorosulfonic acid polymer-containing film (commercial Nafion (trade mark) film) is prepared.

The power supply 8 of the electric field applier is turned on and a DC electric field having a potential difference of 1 to 3 V is applied between the first electrode 6 and the second electrode 7. The distance from the first electrode 6 to the semiconductor main surface is 55 mm. There is the first solution 9 for 50 mm out of 55 mm. The distance from the second electrode 7 to the catalyst layer main surface is 55 mm. There is the second solution 10 for 50 mm out of 55 mm.

A trench 13 extending in a downward direction along the z-axis direction from the bottom of the groove 3c of the semiconductor substrate 3a is formed by performing etching in such a manner.

According to at least the foregoing embodiment, it is possible to provide an etching apparatus and an etching method with which processing defects can be reduced. Invention according to embodiments are appended below.

An embodiment provides an etching apparatus in which a semiconductor substrate having a first main surface and a second main surface located opposite to the first main surface, a catalyst layer formed on the second main surface of the semiconductor substrate, a first solution capable of dissolving an oxide of a semiconductor substrate material, and a second solution containing an oxidizing agent are to be used, the apparatus including:

a first container configured to store the first solution and including an opening covered by the first main surface of the semiconductor substrate;

a second container configured to store the second solution and including an opening covered by a surface of the catalyst layer;

a first flow path configured to communicate with the first container;

a second flow path configured to communicate with the second container;
a cation exchange film interposed between the first flow path and the second flow path and allowing at least protons to pass through; and
an electric field applier configured to apply an electric field to the semiconductor substrate.

An embodiment provides an etching method including:
forming a concave part by crystal anisotropic etching on a first main surface of a semiconductor substrate,
forming a catalyst layer on a second main surface located opposite to the first main surface of the semiconductor substrate;
performing etching on the first main surface, with a first solution capable of dissolving an oxide of a semiconductor substrate material being in contact with the first main surface of the semiconductor substrate, with a second solution containing an oxidizing agent being in contact with the catalyst layer, with protons being able to diffuse in the first solution and the second solution via a cation exchange film which allows at least protons to pass through, and with an electric field being applied to the semiconductor substrate.

An embodiment provides a pattern forming method including:
forming a concave part by crystal anisotropic etching on a first main surface of a semiconductor substrate;
forming a catalyst layer on a second main surface located opposite to the first main surface of the semiconductor substrate;
performing etching on the first main surface, with a first solution capable of dissolving an oxide of a semiconductor substrate material being in contact with the first main surface of the semiconductor substrate, with a second solution containing an oxidizing agent being in contact with the catalyst layer, with protons being able to diffuse in the first solution and the second solution via a cation exchange film which allows at least protons to pass through, and with an electric field being applied to the semiconductor substrate, thereby forming a trench; and
forming an interconnect pattern by forming a conductive structure to be in contact with a wall surface of the trench.

An embodiment provides a method of manufacturing a semiconductor device including:
forming a concave part by crystal anisotropic etching on a first main surface of a semiconductor substrate;
forming a catalyst layer on a second main surface located opposite to the first main surface of the semiconductor substrate,
performing etching on the first main surface, with a first solution capable of dissolving an oxide of a semiconductor substrate material being in contact with the first main surface of the semiconductor substrate, with a second solution containing an oxidizing agent being in contact with the catalyst layer, with protons being able to diffuse in the first solution and the second solution via a cation exchange film which allows at least protons to pass through, and with an electric field being applied to the semiconductor substrate; and
forming an interconnect layer above the semiconductor substrate.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

The invention claimed is:

1. An etching apparatus in which a semiconductor substrate having a first main surface and a second main surface located opposite to the first main surface, a catalyst layer formed on the second main surface of the semiconductor substrate, a first solution capable of dissolving an oxide of a semiconductor substrate material, and a second solution containing an oxidizing agent are to be processed,
the etching apparatus comprising:
a first container configured to store the first solution and including an opening covered by the first main surface of the semiconductor substrate;
a second container configured to store the second solution and including an opening covered by a surface of the catalyst layer;
a first flow path configured to communicate with the first container;
a second flow path configured to communicate with the second container;
a cation exchange film interposed between the first flow path and the second flow path and allowing at least protons to pass through; and
an electric field applier configured to apply an electric field to the semiconductor substrate,
wherein the electric field applier includes a first electrode outside the first container, a second electrode outside the second container, and a direct current power supply whose negative pole is electrically connected to the first electrode and whose positive pole is electrically connected to the second electrode, and
the electric field applier is configured to generate an electric field between the first electrode and the second electrode by the direct current power supply, with the first container, the semiconductor substrate, the catalyst layer, and the second container being provided between the first electrode and the second electrode, and thereby is configured to apply the electric field to the semiconductor substrate.

2. The etching apparatus according to claim 1, wherein the opening of the first container is covered by the first main surface of the semiconductor substrate so as to bring the first solution into contact with the first main surface, the opening of the second container is covered by the surface of the catalyst layer so as to bring the second solution into contact with the surface of the catalyst layer, and the semiconductor substrate and the catalyst layer partition between the first solution and the second solution.

3. The etching apparatus according to claim 1, wherein the cation exchange film that allows at least protons to pass through includes a perfluorosulfonic acid polymer.

* * * * *